United States Patent [19]

Chang-Hasnain et al.

[11] Patent Number: 4,922,500
[45] Date of Patent: May 1, 1990

[54] CROSS-COUPLED QUANTUM-WELL STRIPE LASER ARRAY

[75] Inventors: Constance J. Chang-Hasnain, Edison; Elyahou Kapon, Old Bridge, both of N.J.

[73] Assignee: Bell Communications Research, Inc., Livingston, N.J.

[21] Appl. No.: 341,634

[22] Filed: Apr. 21, 1989

[51] Int. Cl.$^5$ ............................................. H01S 3/19
[52] U.S. Cl. ......................................... 372/50; 372/45; 372/46; 372/48; 372/96; 437/129
[58] Field of Search ........................ 372/50, 45, 46, 43, 372/48, 96, 108; 357/4; 437/129

[56] References Cited

U.S. PATENT DOCUMENTS

| | | | |
|---|---|---|---|
| 4,573,158 | 2/1986 | Utaka et al. | 372/96 |
| 4,803,692 | 2/1989 | Sakano et al. | 372/96 |
| 4,820,655 | 4/1989 | Noda et al. | 372/96 |

OTHER PUBLICATIONS

"Patterned Quantum Well Heterostructures Grown by OMCVD on Non-Planar Substrates: Applications to Extremely Narrow SQW Lasers," *Journal of Crystal Growth*, 93, R. Bhat et al., 1988, pp. 850–856.
"Patterned Quantum Well Semiconductor Injection Laser Grown by Molecular Beam Epitaxy," *Applied Physics Letters*, 52, E. Kapon et al., 1988, pp. 607–609.
"Low-Threshold Patterned Quantum Well Lasers Grown by Molecular Beam Epitaxy," Electronics Letters, 24, No. 16, E. Kapon et al., 1988, pp. 985–986.
"Patterned Quantum Well Semiconductor Laser Arrays," *Applied Physics Letters*, 54, No. 4, E. Kapon et al., 1989, pp. 304–306.
"Diffraction Coupled Phase-Locked Semiconductor Laser Array," *Applied Physics Letters*, 42, J. Katz et al., 1983, pp. 554–556.
"Molecular Beam Epitaxy of GaAs/AlGaAs Superlattice Heterostructures on Nonplanar Substrates," *Applied Physics Letters*, 50, No. 6, E. Kapon et al., 1987, pp. 347–349.
"TEM Investigation of Epitaxial Growth of Semiconductor Superlattices on Structured Substrates," Materials Research Symposium, 77, D. M. Hwang et al., 1987, pp. 773–778.
"Patterned Quantum Well Semiconductor Injection Lasers", *XVI International Conference on Quantum Electronics Digest*, E. Kapon et al., 1988, pp. 30–31.
"Lateral Patterning of Semiconductor Superlattice Heterostructures by Epitaxial Growth on Nonplanar Substrates," *Proceedings of SPIE*, 944, E. Kapon et al., 1988, pp. 80–91.
"TEM Studies of GaAs/AlGaAs Heterostructures Grown on Patterned Substrates", *Matterials Research Society Symposium Proceedings*, 102, D. M. Hwang et al., 1988, pp. 209–214.
"Patterned GaAs/AlGaAs Superlattice Heterostructures by Epitaxial Growth on Nonplanar GaAs Substrates," *Superlattices and Microstructures*, 4, No. 3, E. Kapon et al., 1988, pp. 297–301.

Primary Examiner—William L. Sikes
Assistant Examiner—Georgia Y. Epps
Attorney, Agent, or Firm—James W. Falk; Charles S. Guenzer

[57] ABSTRACT

A cross-coupled stripe laser array in which a substrate is formed with parallel grooves extending part way across the substrate and an area adjacent interior ends of the grooves is left planar. The orientations of the substrate and the grooves are chosen so as to produce differential epitaxial growth rates between the areas overlying the grooves and the area overlying the planar portion. A vertically confining optical structure is then deposited over both the grooved and planar portions. The structure includes a quantum well region, the bandgap of which depends upon its thickness. Electrical contacts are applied over the grooved regions. Thereby, the lasers overlying the grooves lase at a wavelength to which the equivalent structure overlying the planar portion is transparent, thus providing coupling between the stripe lasers.

15 Claims, 4 Drawing Sheets

CROSS-COUPLED QUANTUM-WELL STRIPE LASER ARRAY

FIELD OF THE INVENTION

The invention relates generally to a structure of coupled optical components in an optical integrated circuit. In particular, the invention relates to a cross-coupled stripe laser array.

BACKGROUND OF THE INVENTION

Semiconductor optical components have been extensively developed for use as optical emitters and detectors, particularly for discrete devices. The use of III-V semiconductor compounds allows the wavelength of these devices to be tailored to particular needs. There is strong desire in the field, however, to integrate a number of optical components on a single semiconductor device, that is, a desire for monolithic integration of both active and passive optical devices in a single integrated optical circuit. Such integration presents a significant difficulty for optical components. Optical emitters, e.g., diode lasers, and optical detectors, e.g., photosensitive diodes, are active in a wavelength region in which the active layer of the component is strongly light absorbing. For diode lasers, the lasing wavelength is closely related to the bandgap $E_g$ of the active layer. Similarly, photosensitive diodes respond primarily to light of higher energy than the bandgap of their active layers. In contrast, passive optical components, e.g., optical waveguides, require a waveguiding layer which is non-absorbing. In terms of bandgap, the waveguiding layer must have a bandgap larger than the energy of the light it transmits.

These differing requirements of the bandgaps of the active and transmitting (transparent) layers have necessitated relatively complex optical integrated circuits and long processes for fabricating them. For the most part, the requirement is met by depositing one III-V compound for the laser active region and another III-V compound for the waveguiding layer. There then arises the problem of coupling the light from the active laser region to the waveguide region and the difficulty of multi-growth steps.

One example of coupled optical devices is a stripe laser array. A typical semiconductor laser extends as an active layer between two current injecting layers. In order to obtain a high power beam with a stable output mode, it is well known to form a multiplicity of parallel stripe lasers. However, phase jitter between the lasers can be a problem and in some structures it is typical that a stripe laser is 180° out of phase with another closely spaced stripe laser, resulting in a double-lobed far field output pattern. This problem has been at least partially solved by diffraction coupling the optical outputs of the strips lasers. For instance, Katz et al discloses in a technical article entitled "Diffraction coupled phase-locked semiconductor laser array" appearing in Applied Physics Letters, volume 42, 1983 at pages 554-556 a laser structure which is generally planar so as to confine light vertically and to vertically inject current. However, the upper cladding layer is etched over only a central area so as to form parallel horizontal waveguides. The waveguides control the modes but the cross-coupling in the horizontally non-defined end sections locks the phase between the stripes. Nonetheless, the Katz approach injects current into the end sections, which otherwise strongly absorbs light emitter by the array section.

SUMMARY OF THE INVENTION

Accordingly, it is an object of this invention to provide an integrated optical device and method of making it which are simple and involve the minimum number of fabrication steps.

In particular, it is an object of this invention to provide a cross-coupled stripe laser array of superior characteristics.

The invention can be summarized as a stripe laser array and its method of making. A crystalline multicomponent substrate is patterned with parallel grooves having at least one set of ends terminating in an interior of the device area. A light confining structure is then epitaxially deposited thereover both the grooved section and the planar section of the substrate. The light confining structure has a quantum well layer, the bandgap of which depends on the thickness of the quantum well layer. Stripe lasers are defined by each of the grooves. The orientations of the substrate and of the grooves are chosen such that the subsequent epitaxial growth rate is higher in the grooves than in the planar area. Thus, the bandgap of the quantum well in the grooved area is lower than that in the planar. Thereby, the quantum well region can be lased at one wavelength in the grooved areas and the same quantum well layer in the planar region is transparent at that wavelength, thus providing effective optical coupling between the stripe lasers.

DETAILED DESCRIPTION

Figure 1:
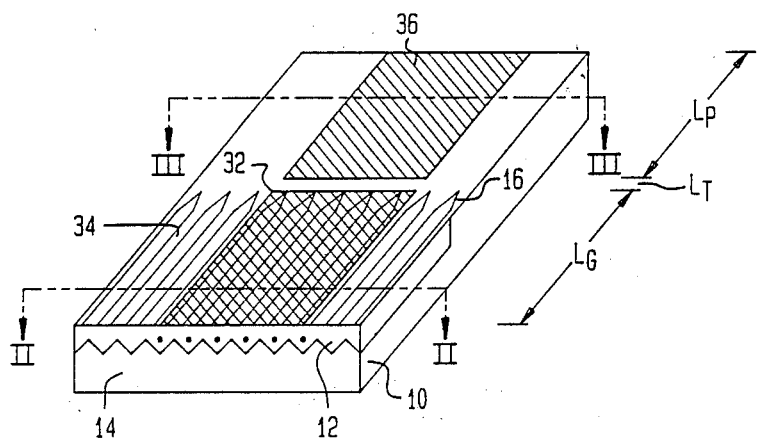
FIG. 1 is a perspective view of a cross-coupled stripe laser array, according to one embodiment of the invention.

Quantum well semiconductor effects have become well known in recent years. In a planar or two-dimensional quantum well structure, the thickness of a semiconductor layer is small enough that the effective bandgap of the layer depends on the thickness. The thinner the layer, the wider the bandgap. For GaAs/AlGaAs materials, these quantum effects become noticeable at thicknesses less than 50 nm. A relatively thick quantum well structure can be achieved by growing a superlattice structure with each of the active layers being of quantum thickness.

It has been further observed that epitaxial crystal growth rates in zincblende semiconductors depend greatly upon the orientation of the exposed substrate and that a grooved substrate shows non-uniform growth. This effect has been described by Kapon et al in a technical article entitled "Molecular beam epitaxy of GaAs/AlGaAs superlattice heterostructures on nonplanar substrates" appearing in Applied Physics Letters, volume 50, 1987 at pages 347-349 and by Hwang et al in a technical article entitled "TEM investigation of epitaxial growth of semiconductor superlattices on structured substrates" appearing in Material Research Society Symposium, volume 77, 1987 at pages 773–778. Similar results have been disclosed for organometallic chemical vapor deposition (OMCVD) by Bhat et al in a technical article entitled "Patterned quantum well heterostructures grown by OMCVD on non-planar substrates: Applications to extremely narrow SQW lasers" appearing in Journal of Crystal Growth, volume 93, 1988 at pages 850–856. These differential growth rates in a groove have been exploited to engineer bandgaps in a single deposited layer. A graded-index separate-confinement heterostructure (GRIN-SCH) laser has been fabricated by this method as described by Kapon et al in a technical article entitled "Patterned quantum well semiconductor injection laser grown by molecular beam epitaxy" appearing in Applied Physics Letters, volume 52, 1988 at pages 607–609 and by Kapon et al in another technical article entitled "Low-threshold patterned quantum well lasers grown by molecular beam epitaxy" appearing in Electronics Letters, volume 24, 1988 at pages 985–986. In this described method, a trapezoidal groove is formed in a GaAs substrate at a predetermined orientation. The groove has a fast growth crystalline orientation on the bottom of the groove and a slow growth orientation on the sides of the groove. A series of III-V layers are then epitaxially deposited, including an GaAs quantum well layer. Because of the differential growth rates, the quantum well layer is 7 nm thick on the bottom of the groove but 3 to 4 nm thick on the groove sides. The result is that the thinner quantum well layer on the groove sides, having a larger bandgap, confines carriers vertically injected into the thicker quantum well layer on the groove bottom.

Figure 2:
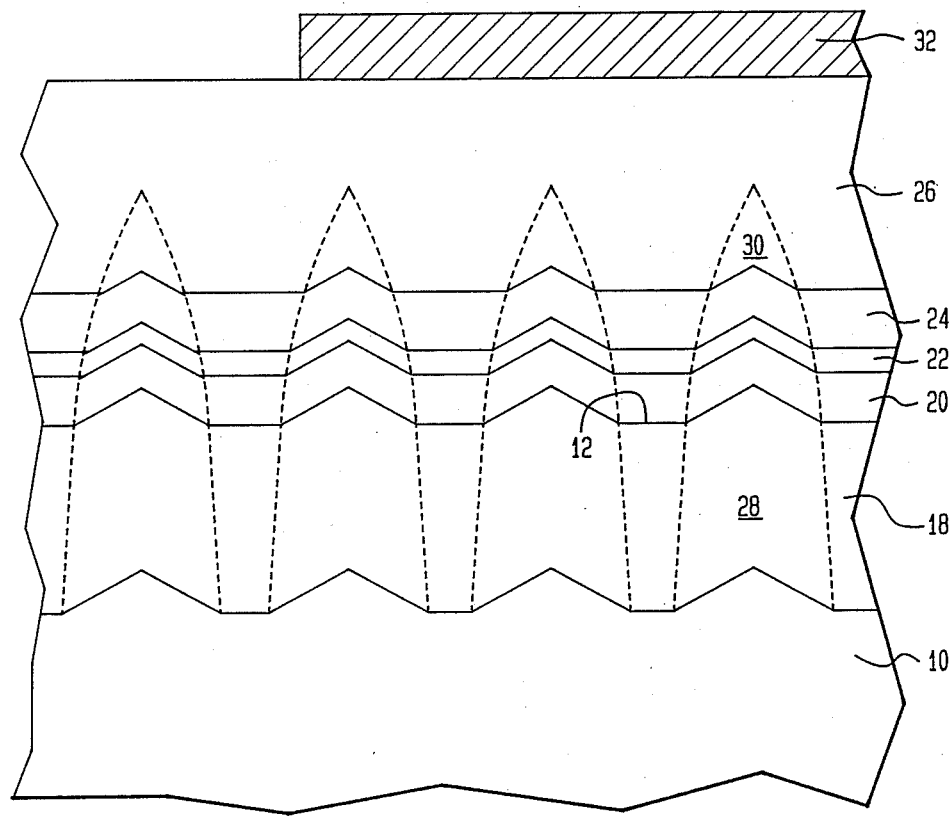
FIG. 2 is a cross-sectional view taken along sectional line II—II in FIG. 1.

One embodiment of the present invention extends these ideas to provide cross coupling between separate lasing regions in a stripe laser array structure by means of a uniform light propagating region at an end of the stripe region. The stripe laser array of Katz differs in one respect that his cross coupling region has the same bandgap as his laser stripes. The details of the fabrication and some of the secondary structure are described in the above references to GRIN-SCH lasers and are further described by Kapon et al in a technical article entitled "Patterned quantum well semiconductor laser arrays" appearing in Applied Physics Letters, volume 54, 1989 at pages 304–306. In general terms, as illustrated in FIGS. 1 and 2, an n$^+$-GaAs substrate 10 has an upper exposed (100) crystalline surface. A photolithographic mask is formed on the substrate surface with parallel fingers which are 2 $\mu$m wide and arranged on a pitch of 3.5 $\mu$m. The fingers extend along the [01$\bar{1}$] direction of the substrate 10. Etching with $H_2SO_4$:$H_2O_2$(30%):$H_2$ (1:8:40 by volume) produces an array of V-shaped grooves 12 in the substrate 10. The mask is then removed and the wafer is etched again, first in HCl for 2 min, then in $H_2SO_4$:$H_2O_2$(30%):$H_2O$ (4:1:1 by volume) for 1 min, and finally in HCl for another 2 min. The subsequent etching produces a generally trapezoidal groove cross-section, illustrated in FIG. 2, having a depth of approximately 1 $\mu$m. Importantly for the invention, the mask fingers and therefore the grooves 12, as illustrated in FIG. 1, extend only a finite distance $L_G$ from an emitting facet 14 of the substrate 10. The grooves connect with a uniformly etched area extending over a distance $L_P$, as additionally illustrated in cross-section in FIG. 3. The bottom of the uniformly etched area is generally level with the bottom of the grooves 12. For the required light coupling across the groove-plane interface, to be described later, it has been found necessary to provide an outward groove taper 16 of length $L_T$ at the inner ends of the grooves 12. Although a continuous taper would be preferred, the continuous taper is approximated by putting four 0.25 $\mu$m steps spaced along 50 $\mu$m on each side of the 2 $\mu$m mask fingers.

Thereafter, an array of GRIN-SCH lasers are grown by the already known method. However, the epitaxial growth of the graded-index and quantum well layers extends over all the grooved, tapered and planar portions of the substrate 10. Briefly stated, the resultant structure is formed over the substrate in the following order: (1) a cladding layer 18 of $Al_{0.5}Ga_{0.5}As$ of thickness 1.25 $\mu$m and doped to $1\times10^{18}$ cm$^{-3}$ with Si; (2) a lower waveguide or graded-index layer 20 of undoped $Al_xGa_{1-x}As$ of thickness 0.2 $\mu$m with x being linearly graded from 0.5 to 0.2; (3) a quantum well active layer 22 of undoped GaAS of thickness 7 nm in the planar region; (4) an upper waveguide or graded-index layer 24 of undoped $Al_xGa_{1-x}As$ of thickness 0.2 $\mu$m with x being linearly graded from 0.2 to 0.5 $\mu$m; and (5) an $Al_{0.5}Ga_{0.5}As$ cladding layer 26 of thickness 1.25 $\mu$m and doped to $1\times10^{18}$ with Be.

Figure 3:
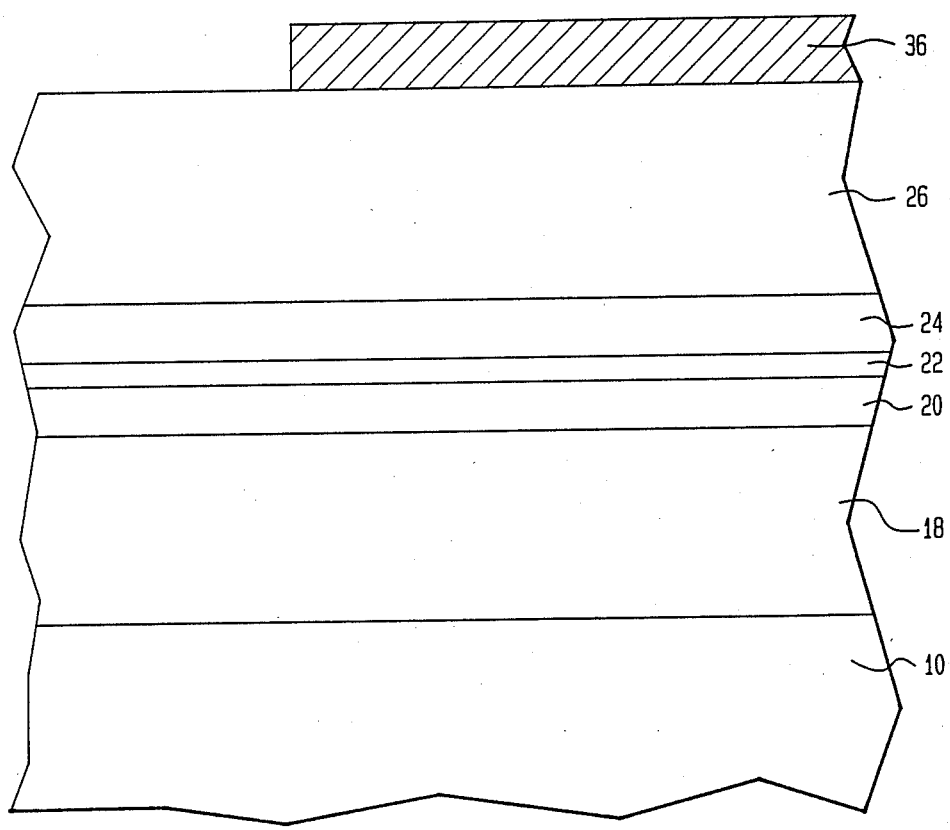
FIG. 3 is a cross-sectional view taken along sectional line III—III in FIG. 1.

As illustrated in FIG. 2, the grooves 12 in the substrate 10 cause significant variations in the subsequent epitaxial growth. Particularly, as described in the 1989 Kapon et al publication, in regions 28 and 30 of the cladding layers 18 and 26 enclosed in dashed lines, the Al mole fraction is increased to $Al_yGa_{1-y}As$ with y>0.5, which acts to further enhance the optical and carrier confinement. The depletion of aluminum from the groove area is visible on the generally flat surface over the upper cladding layer 24 as dark colorations 34, illustrated in FIG. 1, generally following the underlying grooves 12. Furthermore, the thickness of the quantum well layer 22 in the center of the groove 12 is substantially increased from that at the sides, thereby also confining carriers. As illustrated in FIG. 3, the planar portion lacks such variation. Further, the quantum well thickness is less in the planar portion than in the middle of the groove. The thickness of the quantum well layer and thus its bandgap smoothly varies over the changing cross-section in the taper section.

The laser structure is completed by depositing a p$^+$-GaAs contact area 32 over five of the grooves 12. In the first embodiment, the contact region 32 does not extend beyond the taper section. The substrate 10 is attached to a ground plane and is thus used as a counter electrode to the contact area 32.

In the resultant structure, there is a small bandgap quantum well region centered on each of the grooves and surrounded laterally by the thinner quantum well region of higher bandgap. Furthermore, the quantum well region in the planar portion is also relatively thin and therefore of a higher bandgap relative to the center of the grooves 12. When current is injected by the contact area 32, there arises lasing action at a wavelength determined by the quantum well bandgap in the grooves. The light propagates axially along the groove, being subject to pumping so as to build up coherent light. At the tapered region, the light is effectively coupled into the quantum well layer of the planar portion of the substrate. However, the quantum well layer in the planar portion of the substrate has a larger bandgap and is therefore effectively transparent to this wavelength.

The light is diffracted at the interface between the stripe lasers and the wide vertical waveguide. Thereby, light is coupled between the different stripes and the light is phase locked between the stripes. The chip facet at the far end of the planar region reflects laser light back through the transparent planar region into the stripe lasers.

The spatially and spectrally resolved optical output from the emitting facet 14 of the laser array has been measured. For comparison tests, the same device structure was cleaved into three parts, the grooved array area alone, the taper area alone and the planar section alone. The lasing outputs of the array and planar sections were then measured separately from each other. For the array section alone, with no cross coupling, each stripe laser was excited in a number of modes and the modes differed between the stripes. The peak wavelength was at 862.0 nm. In the test with the planar section alone, the laser structure over the planar portion of the substrate was pumped until it lased at 836.6 nm. Therefore, as expected, the quantum well region had a smaller bandgap in the area of the groove.

However, when the 5 stripe lasers are coupled through the waveguide region on the ungrooved substrate, a single mode is excited in each stripe laser. For a groove length $L_G$ of 430 μm and a planar length $L_P$ of 400 μm, the single longitudinal optical mode occurs at 852.9 nm with a threshold current of 430 mA. When the planar length $L_P$ was decreased to 50 μm, the threshold current was reduced to 150 mA.

Figure 4:
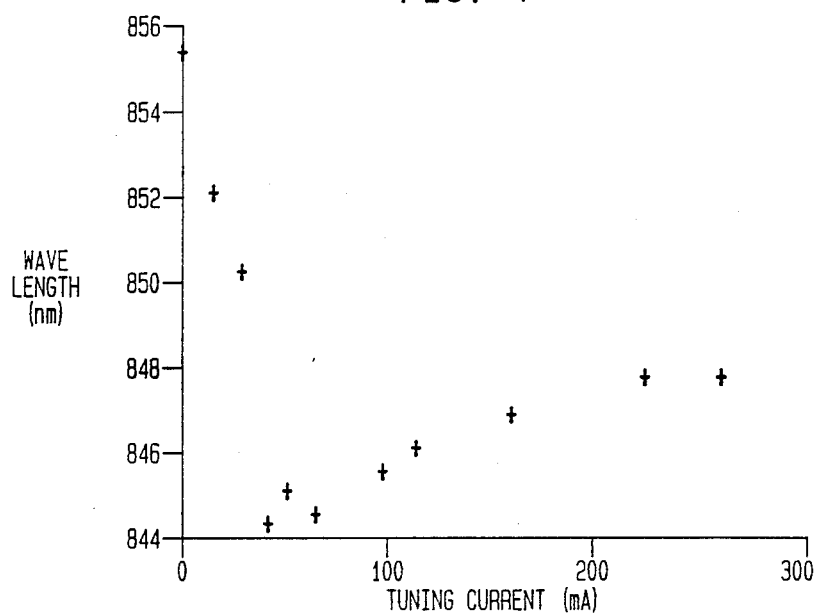
FIG. 4 is a graph of the lasing wavelength for the stripe laser of FIGS. 1-3 as a function of the tuning current applied to the passive coupling section.

The above results were for an unpumped passive coupling region. It was found that the wavelength could be tuned by pumping the coupling region. In particular, a second contact area 36 was deposited simultaneously with the previously mentioned contact area 32 but isolated therefrom by a distance of about 50 μm. In FIG. 4 is shown the optical lasing wavelength dependence as a function of the tuning current applied to the second contact area 34. These data were derived for structures with $L_G$=430 μm, $L_P$=400 μm and a laser pumping current of 40 to 480 mA. The laser output from the array remains phase-locked throughout the tuning range. However, the lasing wavelength decreases with tuning current up to about 50 mA, probably due to a decrease in the residual absorption in the planar region. For yet higher tuning currents, the wavelength increases to a saturation values, probably due to the light from the waveguide section pumping the stripe lasers and thus reducing the threshold for the integrated devices.

The tuning electrode can be directly used for modulation of the stripe laser output. In the low tuning current range, where the laser wavelength is rapidly changing, the tuning current frequency-modulates (FM) the laser output. On the other hand, in the high tuning current range, the frequency change is saturated and further tuning current amplitude-modulates (AM) the laser output.

Figure 5:
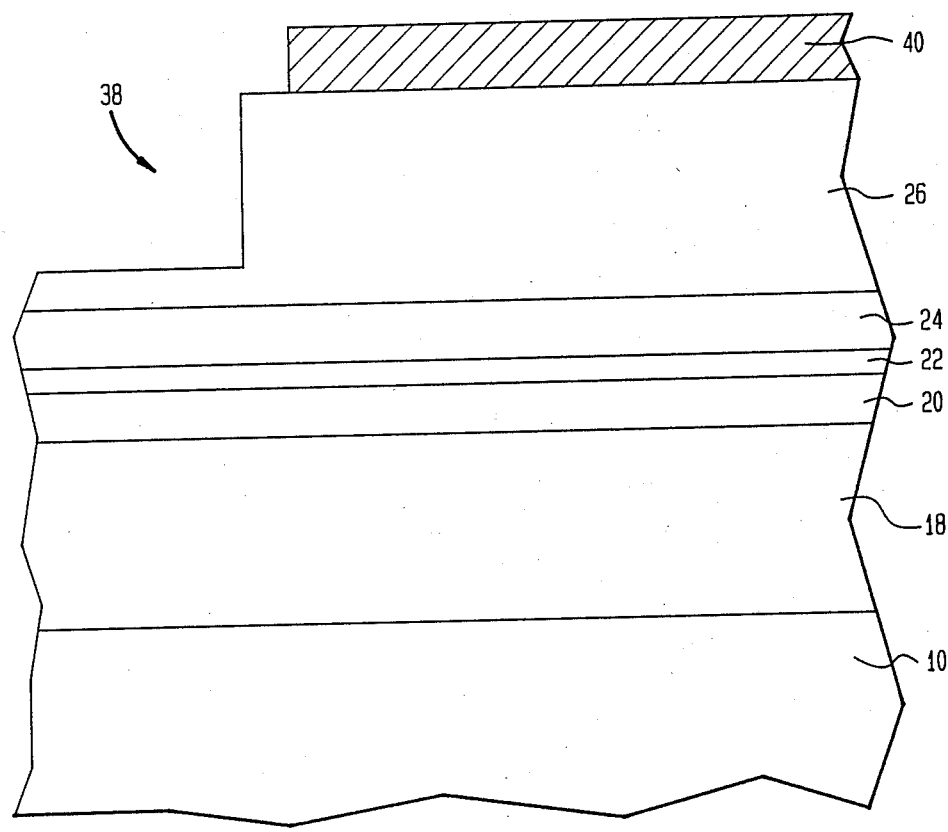
FIG. 5 is a cross-section view of another embodiment of the invention taken along the same cross-section as FIG. 2.

The structure of FIGS. 1 and 3 is disadvantageous for laser efficiency in that light propagating from the stripe lasers into the transparent planar region is not horizontally confined but laterally spreads. Thus, only a fraction of the light is reflected from the back facet back into the stripe lasers. This problem can be reduced by forming a ridge waveguide 38, illustrated in cross-section in FIG. 5, in the area of the second contact area 36 of FIG. 3 but extending adjacent to the taper section. Such a ridge waveguide 38 can be formed by masking all but the desired ridge area and then etching the other areas of the upper cladding layer 26 to within 0.1–0.2 μm of the upper graded index layer 24. Therefore, light is confined both vertically and horizontally. Additionally, an electrode 40 can be placed on top of the ridge waveguide 38 to be used in the same manner as the second contact area 36 for the device of FIGS. 1 and 3. Although the structure of a ridge waveguide laser is produced, light of the lasing wavelength is absorbed in the smaller bandgap grooves. However, the ridge waveguide laser structure is transparent to the stripe laser radiation.

As was pointed out in the 1989 Kapon et al publication, the concept of differential epitaxial growth on nonplanar substrates can be applied to a number of useful devices. That reference demonstrated that two lasers of differing wavelength could be grown simultaneously on a planar part and a grooved part of the substrate. That reference also points out the possibility of integrating lasers and passive optical waveguides on the same substrate. A single stripe laser, of the sort forming the array of FIG. 2, could then be optically coupled to the transparent, vertically confining structure over the planar region. It is a further extension that a single groove can have a cross-section varying along its length. Properly chosen, the cross-section controls the quantum well thickness and thus the bandgap. Light would be easily guided along a groove with a gradually varying cross-section.

The invention thus provides for an efficient stripe laser which can be easily fabricated. No complex structure or lengthy fabrication is required to couple two or more optically active regions with an optically transparent region. In particular, all the stripe lasers are optically coupled so as to fix the phase without the necessity of pumping the coupling region.

What is claimed is:

1. An optical integrated circuit, comprising:
   a crystalline substrate having a first portion with a first cross section along a first optical axis and a second portion with a second cross section different from said first cross section and along a second optical axis; and
   an optical confining structure formed epitaxially vertically over and continuous between said first and second portions, said optical confining structure including at least one quantum well layer having a first thickness and a first bandgap in a first region overlying said first portion and a second thickness and a second bandgap different from said first thickness and said first bandgap respectively in a second region overlying said second portion, said quantum well layer acting as an active layer in one of said first and second regions.

2. An optical integrated circuit as recited in claim 1, wherein said said first and second optical axes are part of a common straight optical axis and said first cross section and said second cross section are connected by a continuously varying cross section along said common optical axis.

3. An optical integrated circuit as recited in claim 1, wherein said substrate and said optical confining structure each comprises a multicomponent zincblende semiconductor.

4. A coupled stripe laser array, comprising: a crystalline substrate having formed therein a plurality of parallel grooves extending partially across a principal face of said substrate in a grooved portion of said substrate, a substantially planar portion of said substrate being adjacent an interior end of said grooves;

an optical vertically confining structure being formed epitaxially over said substrate and being continuous from said grooved portion to said planar portion, said optical vertically confining structure including at least one quantum well layer, acting as an active layer in an area overlying said grooved portion, said grooves having an orientation whereby said quantum well layer is thicker near an axial center of said grooves in said grooved portion than in said planar portion; and means for injecting current through said optical vertically confining structure in said grooved portion.

5. A coupled stripe laser array as recited in claim 4, wherein said substate and said quantum well layer each comprises a multi-component semiconductor material.

6. A coupled stripe laser array as recited in claim 4, wherein said optical vertically confining structure comprises a first waveguiding layer of a first semiconductor type on which said quantum well layer is epitaxially formed and a second waveguiding layer of a second semiconductor type epitaxially formed on said quantum well layer.

7. A coupled strip laser array as recited in claim 4, wherein said plurality of grooves comprise at least three grooves.

8. A coupled stripe laser array as recited in claim 4, wherein said grooves are tapered at said interior end.

9. A coupled stripe laser array as recited in claim 4, wherein said current injecting means is first current injecting means and further comprising second means for injecting current, said second current injecting means injecting current into said quantum well layer in said planar portion and being separate from said first current injecting means.

10. A coupled stripe laser array as recited in claim 4, wherein said quantum layer is substantially thicker overlaying an axial center of said groove than overlaying an area between said grooves.

11. A coupled stripe laser array as recited in claim 4, further comprising a horizontally confining optical waveguide including said quantum well layer and formed in said planar portion and optically coupled to said interior end of said grooves.

12. A coupled stripe laser array as recited in claim 11, wherein said current injecting means is first current injecting means and further comprising second means for injecting current, said second current injecting means injecting current into said quantum well layer in said horizontally confining optical waveguide independently of said first current injecting means.

13. An optical integrated circuit as recited in claim 12, wherein each of said substrate and said optical vertically confining structure comprises a multicomponent zincblende semiconductor.

14. An optical integrated circuit, comprising:

a crystalline substrate having formed therein at least one groove parallel to an optical axis, at least one end of said at least one groove terminating within an interior area of said substrate adjacent a planar area of said substrate;

an optical vertically confining structure epitaxially formed on an area over said at least one groove and said planar area and being continuous therebetween, said structure including at least one continuous quantum said at least one groove, said substrate and said optical axis having predetermined orientations providing that a thickness of said quantum well layer varies between said area over said at least one groove and said planar area; and an optical horizontally confining structure formed over said planar area.

15. A method of making an optical integrated circuit, comprising the steps of:

forming a plurality of parallel grooves in a crystalline substrate of a multicomponent semiconductor, said grooves terminating in an interior surface area of said substrate, whereby said substrate is formed with a grooved area and a planar area; and sequentially depositing a plurality of layers of semiconductor materials of multicomponent crystalline structure over said grooved area and said planar area, said depositing step including depositing at least one of said layers of sufficient thinness to form a quantum well layer.

* * * * *

UNITED STATES PATENT AND TRADEMARK OFFICE
CERTIFICATE OF CORRECTION

PATENT NO. : 4,922,500

DATED : May 1, 1990

INVENTOR(S) : Constance J. Chang-Hasnain and Elyahou Kapon

It is certified that error appears in the above-identified patent and that said Letters Patent is hereby corrected as shown below:

Column 1, line 58, "strips" should read --stripe--.
Column 8, line 24, "quantum said" should read --quantum well layer, acting as an active layer in said area over said--.

Signed and Sealed this

Sixteenth Day of July, 1991

Attest:

HARRY F. MANBECK, JR.

*Attesting Officer*   *Commissioner of Patents and Trademarks*